United States Patent
Arima et al.

(10) Patent No.: US 8,333,522 B2
(45) Date of Patent: Dec. 18, 2012

(54) DEVELOPING APPARATUS, DEVELOPING METHOD AND STORAGE MEDIUM

(75) Inventors: Hiroshi Arima, Kumamoto (JP);
Kousuke Yoshihara, Kumamoto (JP);
Yuichi Yoshida, Kumamoto (JP);
Yasushi Takiguchi, Kumamoto (JP);
Taro Yamamoto, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 132 days.

(21) Appl. No.: 13/025,490

(22) Filed: Feb. 11, 2011

(65) Prior Publication Data
US 2011/0200953 A1    Aug. 18, 2011

(30) Foreign Application Priority Data

Feb. 15, 2010    (JP) .................................. 2010-030524

(51) Int. Cl.
*G03D 5/00* (2006.01)
(52) U.S. Cl. ....................................................... 396/611
(58) Field of Classification Search .................... 396/611
See application file for complete search history.

(56) References Cited

U.S. PATENT DOCUMENTS

| | | | |
|---|---|---|---|
| 8,026,048 B2* | 9/2011 | Ookouchi et al. | 430/423 |
| 2005/0274401 A1* | 12/2005 | Nagami et al. | 134/102.3 |
| 2008/0210261 A1* | 9/2008 | Nagami et al. | 134/21 |
| 2009/0130614 A1* | 5/2009 | Ookouchi et al. | 430/434 |
| 2010/0047725 A1* | 2/2010 | Ono et al. | 430/432 |
| 2011/0200321 A1* | 8/2011 | Takiguchi et al. | 396/577 |
| 2011/0200952 A1* | 8/2011 | Takiguchi et al. | 430/434 |

FOREIGN PATENT DOCUMENTS

| | | |
|---|---|---|
| JP | 57-208135 A | 12/1982 |
| JP | 07-326559 A | 12/1995 |
| JP | 2003-037033 A | 2/2003 |
| JP | 2005-277268 A | 10/2005 |
| JP | 2008-509439 A | 3/2008 |
| JP | 2008-300876 A | 11/2008 |
| JP | 2011-166087 A | 8/2011 |
| JP | 2011-166088 A | 8/2011 |

OTHER PUBLICATIONS

Japanese Office action for 2010-030524 dated Jan. 31, 2012.

* cited by examiner

*Primary Examiner* — Rodney Fuller
(74) *Attorney, Agent, or Firm* — Pearne & Gordon LLP

(57) ABSTRACT

There is provided a developing apparatus capable of achieving high throughput. The developing apparatus includes an airtightly sealed processing vessel that forms a processing atmosphere therein; an atmosphere gas supply unit that supplies an atmosphere gas containing mist of a developing solution into the processing vessel in order to form a liquid film of the developing solution on a surface of a substrate loaded into the processing vessel; and a drying unit that dries the substrate in order to stop a developing process by the liquid film. A reaction between a resist and the developing solution can be stopped. Therefore, a developing process can be performed in parallel with a cleaning process performed by a cleaning module and high throughput is achieved.

15 Claims, 16 Drawing Sheets

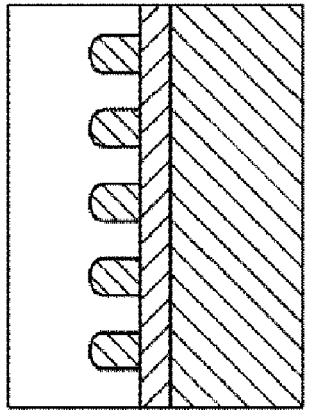
FIG. 12A
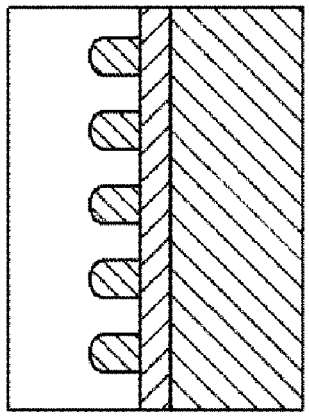
FIG. 12B
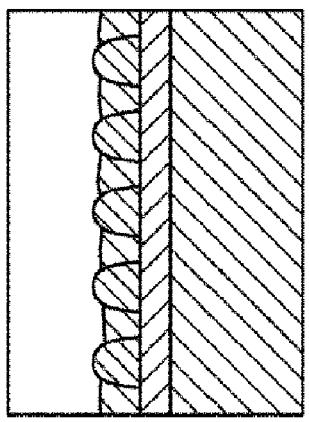
FIG. 12D
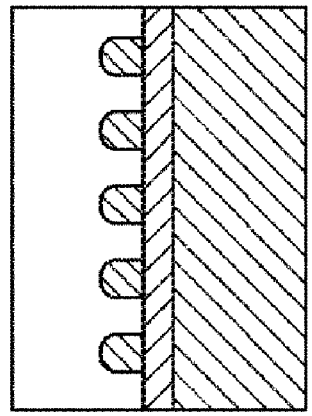
FIG. 12E
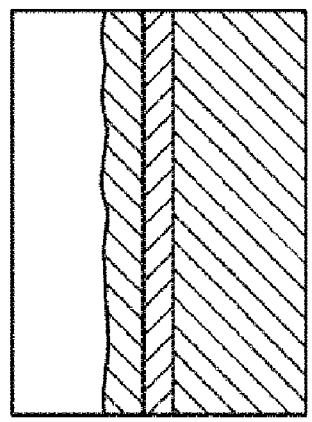
FIG. 12C
FIG. 12F

WAFER W1

WAFER W1

WAFER W2

WAFER W2

DEVELOPING APPARATUS, DEVELOPING METHOD AND STORAGE MEDIUM

CROSS-REFERENCE TO RELATED APPLICATION

This application claims the benefit of Japanese Patent Application No. 2010-030524 filed on Feb. 15, 2010, the entire disclosures of which are incorporated herein by reference.

FIELD OF THE INVENTION

The present disclosure relates to a developing apparatus and a developing method for developing a substrate of which surface is coated with resist and exposed to light and also relates to a storage medium storing a computer program for implementing the developing method.

BACKGROUND OF THE INVENTION

In a conventional developing process for photoresist (hereinafter, simply referred to as "resist"), a developing solution is supplied through a nozzle onto a surface of a semiconductor wafer (hereinafter, simply referred to as a "wafer") that has been coated with resist and exposed to light via a preset pattern. To obtain process uniformity in a wafer surface, the developing solution is supplied such that a liquid film is uniformly formed on the entire surface of the wafer, and the resist is dissolved by the liquid film.

To form the liquid film of the developing solution, there is known a method (puddle type developing process) for accumulating liquid on the entire surface of the wafer by discharging the developing solution onto the stationary wafer while moving a nozzle having an elongated discharge port or there is known a method (puddleless type developing process) for supplying the developing solution in, e.g., a diametric direction of the wafer while rotating the wafer around a vertical axis and coating the developing solution on the wafer by a centrifugal force.

In consideration of the composition of materials of the resist, a reaction between the developing solution and the resist may progress for a relatively short time. In the aforementioned methods, however, a great amount of developing solution has been used to form a uniform liquid film, and a great amount of time has been taken to supply the developing solution onto the wafer. Since the process of supplying the developing solution is so time-consuming, a certain amount of time, e.g., about 30 seconds to about 60 seconds has been required till the reaction between the developing solution and the resist is completed after the supply of the developing solution is begun.

Meanwhile, a liquid immersion exposure process may be performed as an exposure process for a wafer. To suppress an influence of a liquid used in this liquid immersion exposure process upon the wafer, a high water-repellent resist tends to be used. If the high water-repellent resist is used, however, some areas on the resist may not be wet with the developing solution when the resist is developed by the aforementioned methods. Further, a diameter of the wafer tends to increase, and as the diameter of the wafer increases, there is an increasing tendency for the areas not to be wet with the developing solution on the surface of the high water-repellent resist. Accordingly, to form a uniform liquid film of the developing solution for the high water-repellent resist, a greater amount of developing solution may be required, which may cause increase of processing cost and supply time for the developing solution. As a result, high throughput of a developing apparatus may not be achieved.

Thus, the present inventors have considered supplying mist of the developing solution to the wafer to form the liquid film on the entire surface of the wafer. Meanwhile, in a conventional developing apparatus, a mechanism for supplying a developing solution through a nozzle and a cleaning mechanism for cleaning a wafer are installed in the same apparatus. This cleaning mechanism supplies a cleaning solution to the wafer on which the liquid film of the developing solution is formed and performs a cleaning process on the wafer.

Even in the above-described developing apparatus which supplies mist of the developing solution to the wafer, the developing mechanism for supplying the mist of the developing solution and the cleaning mechanism can be installed in the same apparatus in the same manner as the conventional developing apparatus. However, with this configuration, while the mist of the developing solution is supplied to the wafer and while the liquid film of the developing solution and the resist react with each other, the cleaning mechanism cannot perform a cleaning process on the wafer and should stop the process and wait to resume. On the contrary, while the cleaning mechanism is performing a cleaning process, the mechanism for supplying the mist of the developing solution cannot perform a process on the wafer and should stop the process and wait to resume. As a result, sufficient improvement in throughput may not be achieved.

In Patent Document 1, it is disclosed that mist of a developing solution is supplied into a chamber accommodating substrate therein. However, in Patent Document 1, it is not disclosed that the liquid film is removed and the developing process is stopped. Therefore, if the process is performed in such a developing apparatus and then the substrate is transferred to the cleaning apparatus, time of the reaction between the developing solution and the resist may be increased and a pattern shape may be deteriorated.

Patent Document 1: Japanese Patent Laid-open Publication No. 2005-277268 (paragraphs [0139], [0141] and [0178])

BRIEF SUMMARY OF THE INVENTION

In view of the foregoing, the present disclosure provides a developing apparatus and a developing method capable of achieving high throughput, and the present disclosure also provides a storage medium storing a computer program for implementing the developing method.

In accordance with one aspect of the present disclosure, there is provided a developing apparatus that develops an exposed substrate. The developing apparatus includes an airtightly sealed processing vessel that forms a processing atmosphere therein; an atmosphere gas supply unit that supplies an atmosphere gas containing mist of a developing solution into the processing vessel in order to form a liquid film of the developing solution on a surface of a substrate loaded into the processing vessel; and a drying unit that dries the substrate in order to stop a developing process by the liquid film. Herein, the surface of the substrate is dried to remove a liquid in the liquid film from the substrate and components other than a liquid in the developing solution may remain on the substrate.

The atmosphere gas supply unit may supply mist of the developing solution in order to form the liquid film of the developing solution on the surface of the substrate instead of supplying a gas containing vapor of a developing solution into the processing vessel in order to form the liquid film by condensing the developing solution on the surface of the substrate. The drying unit may include a vessel opening/closing mechanism that opens the processing atmosphere within the processing vessel to an external atmosphere. For example, the drying unit may include a mounting plate that is provided in the processing vessel and mounts the substrate thereon; and a heating unit that heats the mounting plate. Further, the drying unit may include a moving plate that receives the substrate mounted within the processing vessel and transfers the substrate to the outside of the processing vessel; and a heating unit that is provided in the moving plate and heats the moving plate. Furthermore, the drying unit may include a drying gas supply unit that supplies a drying gas to the substrate within the processing vessel.

The atmosphere gas supply unit may supply a gas including vapor of a developing solution into the processing vessel in order to form a liquid film by condensing the developing solution on a surface of the substrate instead of supplying the mist of the developing solution in order to form the liquid film of the developing solution on the surface of the substrate. In this case, a temperate control plate on which the substrate is mounted and which controls a temperature of the substrate so as to condense the vapor on the surface of the substrate may be provided. Further, the atmosphere gas supply unit may include a heating unit that heats the atmosphere gas. For example, the atmosphere gas may be heated to a temperature higher than a saturation temperature of the developing solution in a heating atmosphere.

In accordance with another aspect of the present disclosure, there is provided a developing method for developing an exposed substrate. The developing method includes loading the substrate into an airtightly sealed processing vessel that forms a processing atmosphere therein; supplying an atmosphere gas containing mist of a developing solution into the processing vessel to form a liquid film of the developing solution on a surface of the substrate; and drying the substrate in order to stop a developing process by the liquid film.

For example, the liquid film forming process may include supplying mist of the developing solution in order to form the liquid film of the developing solution on the surface of the substrate instead of supplying a gas containing vapor of the developing solution into the processing vessel. The drying process may include opening the processing atmosphere within the processing vessel to an external atmosphere. Further, for example, the drying process may include heating the substrate via a mounting plate when the substrate is mounted on the mounting plate within the processing vessel. Furthermore, the drying process may include receiving the substrate mounted within the processing vessel by a moving plate that moves between the inside and the outside of the processing vessel; and heating the substrate via the moving plate. Furthermore, the drying process may include supplying a drying gas to the substrate within the processing vessel.

The developing method may further include supplying a gas containing vapor of a developing solution into the processing vessel in order to form a liquid film by condensing the developing solution on the surface of the substrate instead of supplying the atmosphere gas containing mist of the developing solution in order to form the liquid film of the developing solution on the surface of the substrate; and controlling a temperature of the substrate such that the vapor is condensed on the surface of the substrate. The developing method may further include heating the atmosphere gas by a heating unit. For example, the atmosphere gas is heated to a temperature higher than a saturation temperature of the developing solution in a heating atmosphere.

In accordance with still another aspect of the present disclosure, there is provided a storage medium that stores therein a program to be used in a developing apparatus that develops an exposed substrate within a processing vessel. Here, the program may include processing steps for implementing the above-mentioned developing method.

A developing apparatus in accordance with the present disclosure includes a drying unit which dries a substrate to stop a developing process by a liquid film formed on a surface of the substrate, and, thus, a reaction between a resist and a developing solution can be stopped and the substrate can be transferred to a cleaning apparatus. Therefore, the developing apparatus and the cleaning apparatus can perform respective processes in parallel and a decrease in throughput can be suppressed.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which:

FIGS. 12A to 12F are longitudinal cross sectional views of wafers obtained in an evaluation test;

DETAILED DESCRIPTION OF THE INVENTION

First Embodiment

Figure 1:
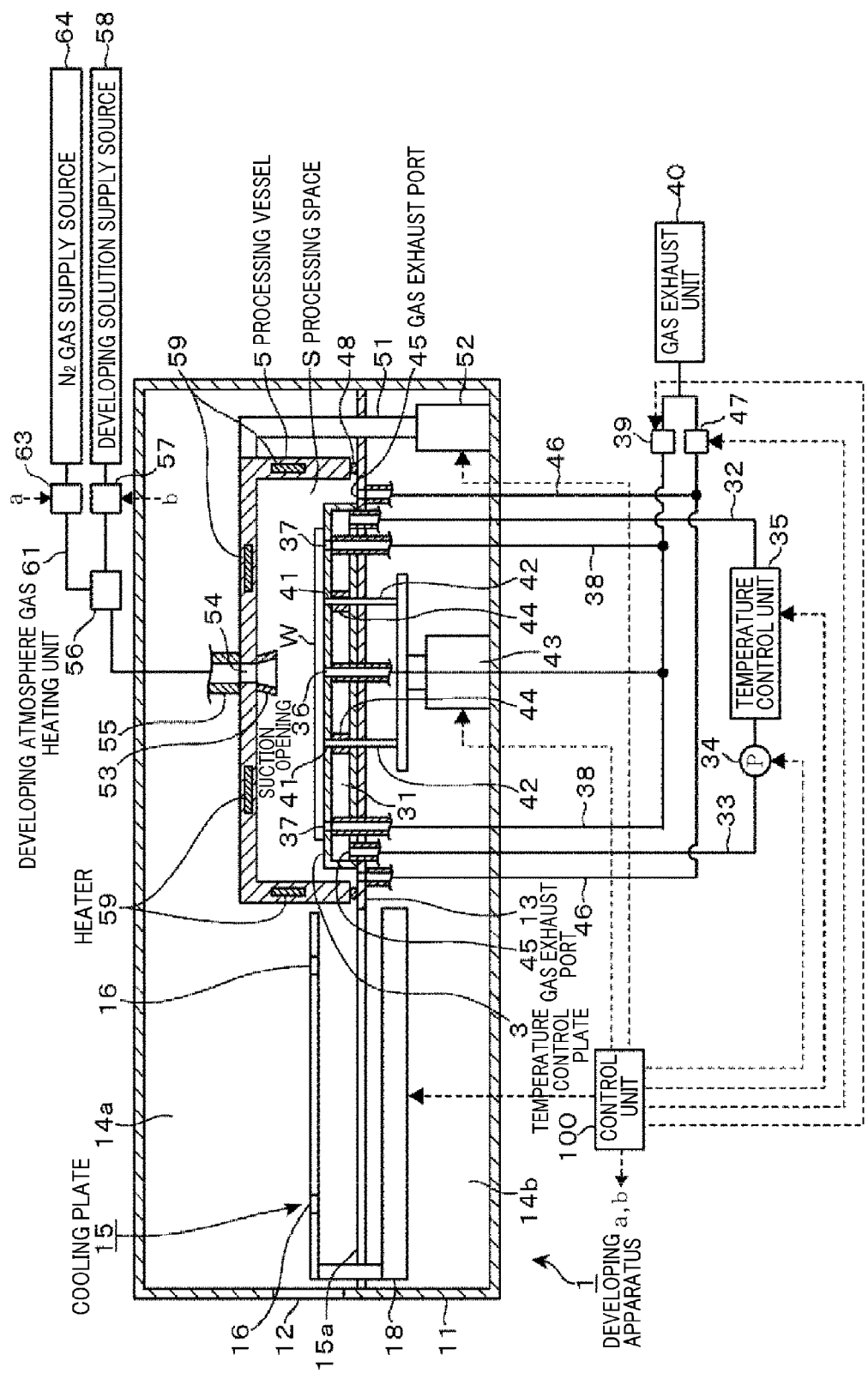
FIG. 1 is a longitudinal cross sectional view of a developing apparatus in accordance with a first embodiment of the present disclosure.
Figure 2:
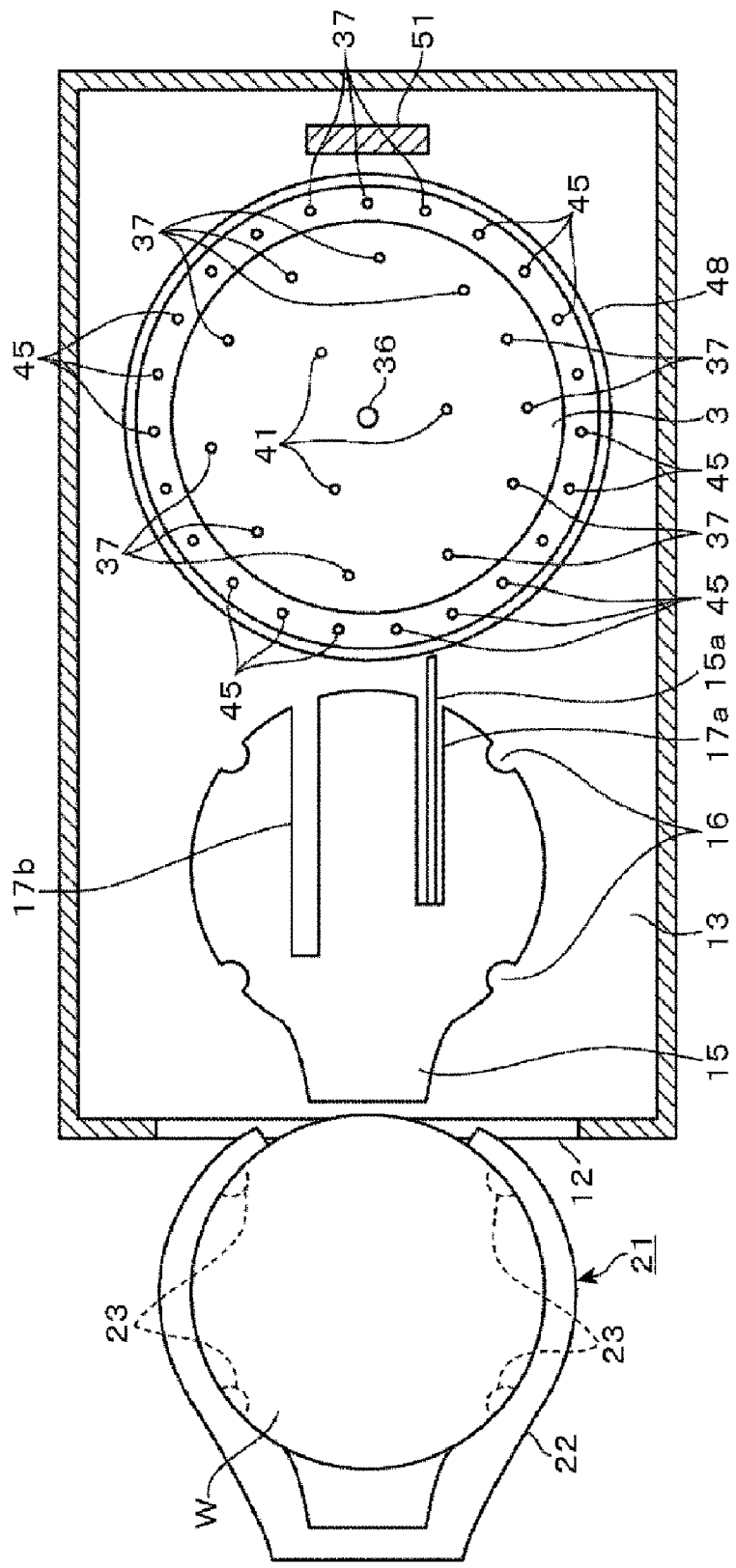
FIG. 2 is a plane view of the developing apparatus.

A developing apparatus 1 in accordance with an embodiment of the present disclosure will be described with reference to FIGS. 1 and 2. FIG. 1 is a longitudinal cross sectional view of the developing apparatus 1, and FIG. 2 is a transversal cross sectional view thereof. The developing apparatus 1 may include a housing 11, and a transfer port 12 for a wafer W is opened in a sidewall of the housing 11. A wafer W is transferred into the housing 11 by a transfer mechanism 21 shown in FIG. 2 through the transfer port 12.

By way of example, a water-repellent resist film is formed on a surface of the wafer W, and the resist film is made of positive resist and is previously exposed to light via a preset pattern by an exposure apparatus. However, the developing apparatus and a developing method in accordance with the present disclosure may also be applied to an organic developing process or a resist film made of negative resist. Here, the organic developing process refers to a developing process of mainly using an organic material as a developing solution. Further, after exposed to light, the wafer W may be subjected to a heating process (post exposure bake: PEB) until the wafer W is transferred into the developing apparatus 1. The transfer mechanism 21 may include an arm 22 configured to surround the circumferential periphery of the wafer W; and a plurality of, e.g., four supports 23 positioned on an inner circumference of the arm 22 so as to support a rear surface of the wafer W.

Provided within the housing 11 is a partition plate 13 that divides the inside of the housing 11 into an upper region and a lower region. The upper region above the partition plate 13 serves as a loading area 14a for loading the wafer W into a processing vessel 5 to be described later. In the loading area 14a, a cooling plate 15 is provided. The cooling plate 15 is formed in a substantially circular shape and is provided with cut-off portions 16 so as not to interfere with the supports 23 of the transfer mechanism 21 when the wafer W is transferred between the transfer mechanism 21 and the cooling plate 15. The cut-off portions 16 are formed from the periphery toward the center of the cooling plate 15. The cooling plate 15 has, in its rear surface, a non-illustrated flow path for flowing therein, e.g., temperature-controlled water. The wafer W, which is previously heated by a heating apparatus before loaded into the developing apparatus 1, is mounted on the cooling plate 15, and the wafer W is cooled.

The cooling plate 15 is provided with slits 17a and 17b, and elevating pins 42 to be described later are protruded from a surface of the cooling plate 15 through the slits 17a and 17b. In a lower area 14b below the partition plate 13, a driving unit 18 is provided so as to move the cooling plate 15 in a horizontal direction along a guide 15a which is extended from a side of the transfer port 12 toward a temperature control plate 3 to be described below.

Figure 3:
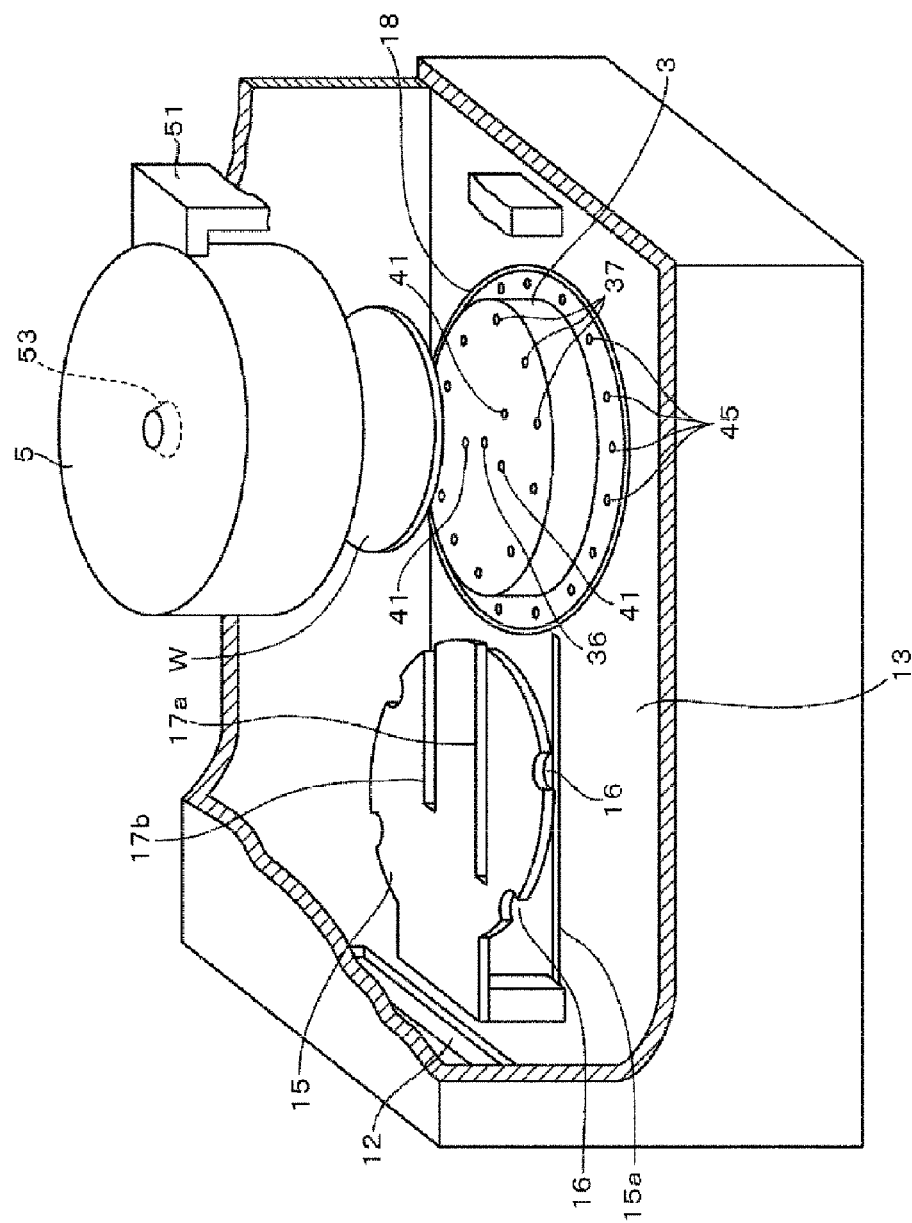
FIG. 3 is a perspective view of the developing apparatus.

FIG. 3 is a perspective view of the developing apparatus 1. As shown in FIG. 3, a circular temperature control plate 3 configured to mount thereon the wafer W is provided in the rear side of the developing apparatus 1. A flow path 31 for a temperature-controlled fluid, e.g., water, is provided within the temperature control plate 3. The temperature control plate 3 is connected with one ends of a temperature-controlled water supply pipe 32 and a temperature-controlled water collection pipe 33, and the other ends of the temperature-controlled water supply pipe and the temperature-controlled water collection pipe 33 are connected with a pump 34. A temperature control unit 35 is provided on the temperature-controlled water supply pipe 32, and the temperature control unit 35 may include a heater for heating water supplied therein and a coolant path for a coolant to cool the water by heat exchange. By controlling an output of the heater and a flow rate of the coolant, the temperature of the water may be controlled to a temperature set by a user.

The temperature-controlled water supply pipe 32, the temperature-controlled water collection pipe 33 and the flow path 31 form a circulation path for temperature-controlled water, and the water supplied into the temperature-controlled water supply pipe 32 by the pump 34 is supplied into the flow path 31 after its temperature is controlled by the temperature control unit 35. Then, the water is collected from the flow path 31 through the temperature-controlled water collection pipe 33 by the pump 34 and then is supplied again into the temperature-controlled water supply pipe 32 and the temperature of the temperature-controlled water is controlled. By flowing the temperature-controlled water as stated above, a temperature of an entire surface of the temperature control plate 3 becomes uniform and is controlled to be substantially the same as the temperature of the water adjusted by the temperature control unit 35. Further, the temperature of the wafer W mounted on the temperature control plate 3 is controlled to be substantially the same as the temperature of the surface of the temperature control plate 3.

A suction opening 36 is opened in a central surface of the temperature control plate 3, and a multiple number of suction openings 37 are opened in a peripheral surface of the temperature control plate 3 along the circumference of the temperature control plate 3. One ends of gas exhaust pipes 38 are respectively connected with the suction openings 36 and 37, and the other ends of the gas exhaust pipes 38 are joined together and connected with a gas exhaust unit 40 including a vacuum pump via a flow rate controller 39. The flow rate controller 39 may include a valve and/or a mass flow controller and control a gas exhaust amount.

Three holes 41 are provided in the surface of the temperature control plate 3 along the circumference of the temperature control plate 3, and the three elevating pins 42 are inserted into the holes 41 in a thickness direction of the temperature control plate 3 (only two elevating pins 42 are shown in FIG. 1 for the simplicity of illustration). The elevating pins 42 are protruded from or retracted into the surface of the temperature control plate 3 by an elevating mechanism 43 and transfers the wafer W between the cooling plate 15 and the temperature control plate 3. Sealing members 44 for preventing leakage of the temperature-controlled water are provided around the elevating pins 42 within the temperature control plate 3.

The partition plate 13 is provided with a multiple number of gas exhaust ports 45 arranged to surround the temperature control plate 3, and one ends of gas exhaust pipes 46 are connected with the gas exhaust ports 45. The other ends of the gas exhaust pipes 46 are joined together and connected with the gas exhaust unit 40 via a flow rate controller 47. The flow rate controller 47 may have the same configuration as that of the flow rate controller 39. Further, an O-ring 48 is provided on the partition plate 13 to surround the gas exhaust ports 45.

The processing vessel 5 is installed above the temperature control plate 3, and the processing vessel 5 is configured as a flat circular vessel having an open bottom. The processing vessel 5 is connected with an elevating mechanism 52 serving as a vessel opening/closing mechanism via a support 51 and is moved up and down by the elevating mechanism 52. As depicted in FIG. 1, a bottom end of the processing vessel 5 comes into contact with the O-ring 48 when the processing vessel 5 is lowered, so that an airtightly sealed processing space (processing atmosphere) S is formed. Heaters 59 which control a temperature of an inner wall of the processing vessel 5 are installed in a wall of the processing vessel 5. Provided in a central bottom surface of a ceiling of the processing vessel 5 is a nozzle 53 for supplying mist of the developing solution into the processing space S. The nozzle 53 is connected with one end of a developing atmosphere gas supply pipe 55 through an opening 54 provided in a central portion of the ceiling of the processing vessel 5.

The other end of the developing atmosphere gas supply pipe 55 is connected with a developing solution supply source 58 storing therein the developing solution via a developing atmosphere gas heating unit 56 and a flow rate controller 57 in this sequence. The developing solution supply source 58 may include a non-illustrated force-feeding unit and supply the developing solution to the downstream side of the developing atmosphere gas supply pipe 55. The flow rate controller 57 may include a valve and/or a mass flow controller, like the flow rate controllers 39 and 47 and control a supply flow rate of the developing solution to the downstream side. The developing atmosphere gas heating unit 56 may mix the developing solution supplied through the developing atmosphere gas supply pipe 55 and a $N_2$ gas supplied through an inert gas supply pipe 61 to be described later and generate the developing atmosphere gas including mist of the developing solution (hereinafter, referred to as "developing mist"). The generated developing atmosphere gas is supplied into the processing space S via the developing atmosphere gas supply pipe 55. Further, the developing atmosphere gas heating unit 56 may include a heating device such as a heater and heat the developing atmosphere gas to a preset temperature.

By way of example, a flow rate of the developing solution supplied into the developing atmosphere gas heating unit 56 by the flow rate controller 57 during a developing process and the temperature of the developing atmosphere gas may be regulated constant in processing each wafer W. Further, a supply time of the developing atmosphere gas into the processing space S and a gas exhaust amount from the gas exhaust ports 45 and the suction openings 36 and 37 may also be regulated constant for each wafer W. Accordingly, a constant amount of developing mist may adhere to each wafer W and a developing solution film 50 of a predetermined thickness is formed on each wafer W. The developing atmosphere gas supply pipe 55 and the developing atmosphere gas heating unit 56 serve as an atmosphere gas supply unit.

In the developing apparatus 1, after a lapse of a preset time from the beginning of the supply of the developing atmosphere gas into the processing space S, a liquid in the developing solution film 50 is removed, and, thus, the surface of the wafer is dried and a reaction between the developing solution and the resist is stopped. Then, the wafer W is transferred to a cleaning apparatus provided outside the developing apparatus 1 and a cleaning process is performed on the wafer W and a resist pattern is developed.

One end of the inert gas supply pipe 61 is connected with the developing atmosphere gas heating unit 56, and the other end of the inert gas supply pipe 61 is connected with a $N_2$ gas supply source 64 storing therein an inert gas such as a $N_2$ gas. The $N_2$ gas may be supplied into the processing space S while being included in the developing atmosphere gas as stated above, or the $N_2$ gas may be independently supplied into the processing space S as a purge gas through the developing atmosphere gas supply pipe 55. By way of example, when the $N_2$ gas is independently supplied into the processing space S, the $N_2$ gas is heated to a predetermined temperature by the developing atmosphere gas heating unit 56 and then supplied into the processing space S.

An operation of each unit in the developing apparatus 1 is controlled by a control unit 100. The control unit 100 may be composed of, e.g., a computer and include a non-illustrated program storage unit. Stored in the program storage unit is a program, e.g., software, including commands for implementing the developing process. The control unit 100 reads out the program and sends a control signal to each component of the developing apparatus 1. Accordingly, the elevation of the processing vessel 5 and the elevating pins 42, the temperature control of temperature-controlled water by the temperature control unit 35, the supply of the temperature-controlled water into the flow path 31 of the temperature control plate 3, the output of the heaters 59 of the processing vessel 5, the supply of the $N_2$ gas or the developing atmosphere gas into the processing space S may be controlled. The program may be stored in the program storage unit by being stored in a storage medium such as a hard disk, a compact disk, a magnet optical disk or a memory card.

Hereinafter, an operation of the developing apparatus will be explained with reference to FIGS. 4A to 7B. FIGS. 8A to 8E illustrate changing states of a surface of a wafer W according to the processes performed by the developing apparatus 1 and the cleaning apparatus. The temperature-controlled water is supplied into the flow path 31 of the temperature control plate 3 and a temperature of the surface of the temperature control plate 3 is controlled to a preset temperature, e.g., about 20° C. Further, evacuation in a certain gas exhaust amount is performed through the gas exhaust ports 45 and the suction openings 36 and 37, and temperature of the inner wall of the processing vessel 5 is controlled by the heaters 59 to a temperature the same as, e.g., a temperature of a developing atmosphere gas supplied onto the wafer W.

Figure 4A:
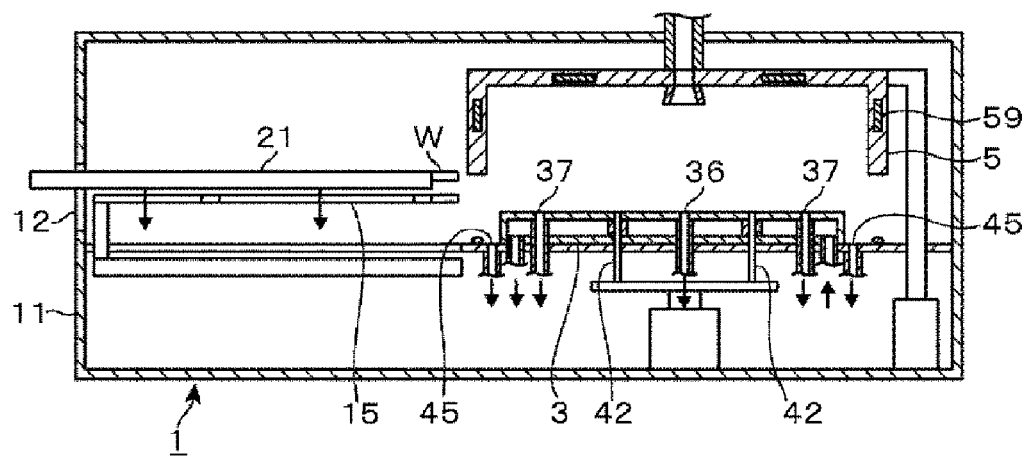
FIGS. 4A to 4C are process diagrams for illustrating a process sequence performed by the developing apparatus.
Figure 4B:
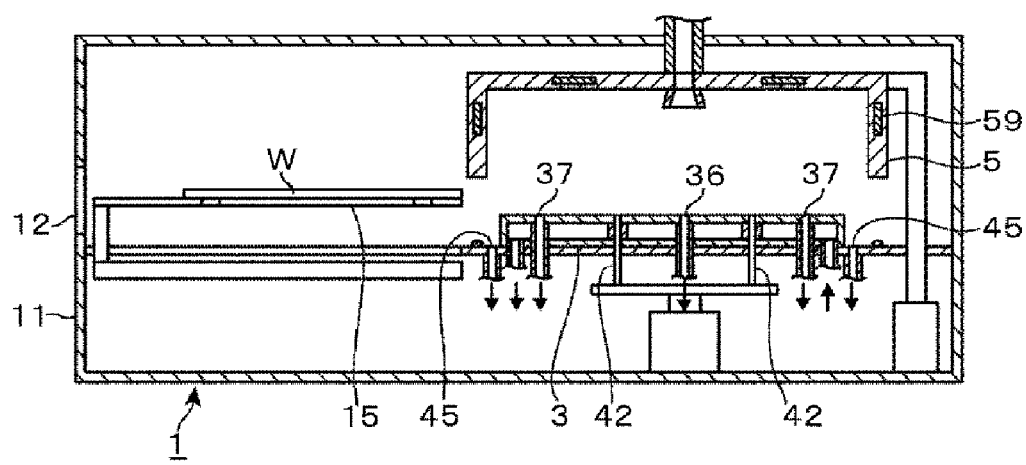
Figure 8A:
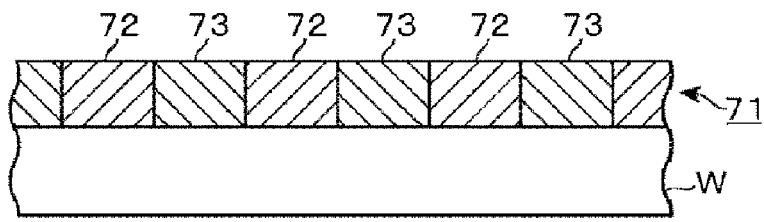
FIGS. 8A to 8E are explanatory diagrams showing changes in a surface of a wafer.

Subsequently, the transfer mechanism 21 is loaded into the housing 11 through the transfer port 12 while holding thereon a wafer W which is previously heated by the heating apparatus of the developing apparatus 1 (FIG. 4A). Then, the transfer mechanism 21 is retreated out of the housing 11 after it transfers the wafer W onto the cooling plate 15 (FIG. 4B). FIG. 8A shows a surface of the wafer W at this time, and a resist film 71 on the surface includes an exposed part 72 and a non-exposed part 73.

Figure 4C:
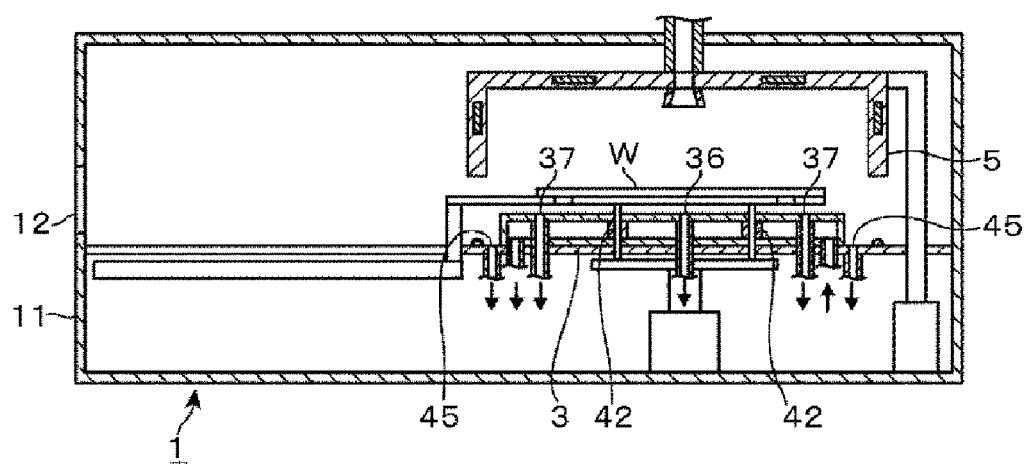
Figure 5A:
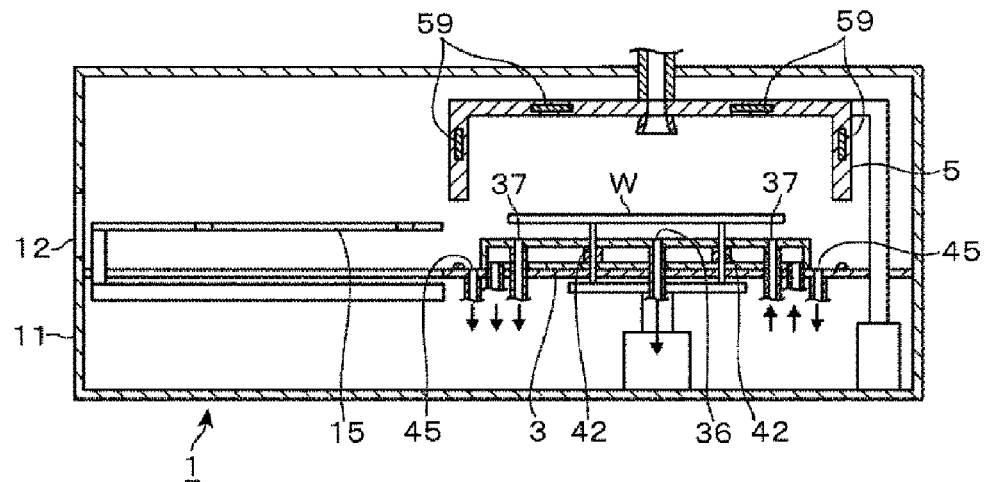
FIGS. 5A to 5C are process diagrams for illustrating a process sequence performed by the developing apparatus.
Figure 5B:
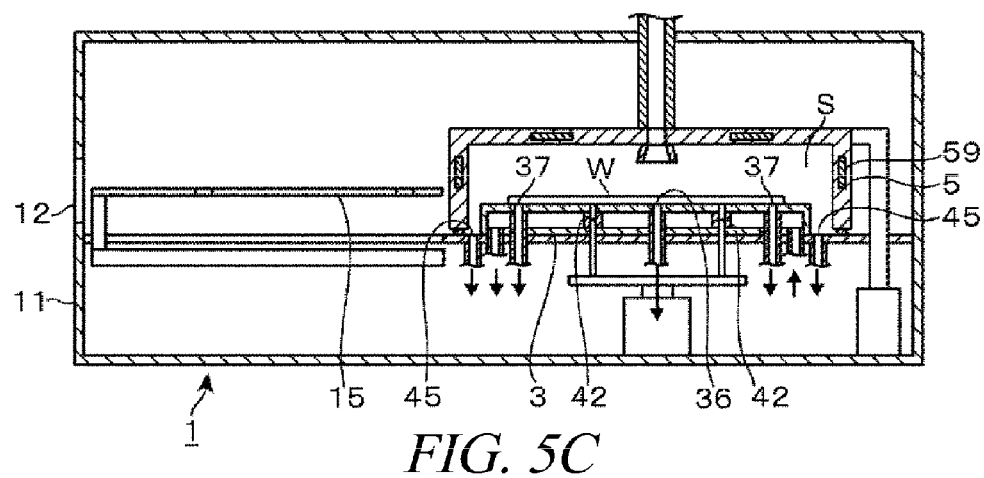
Figure 5C:
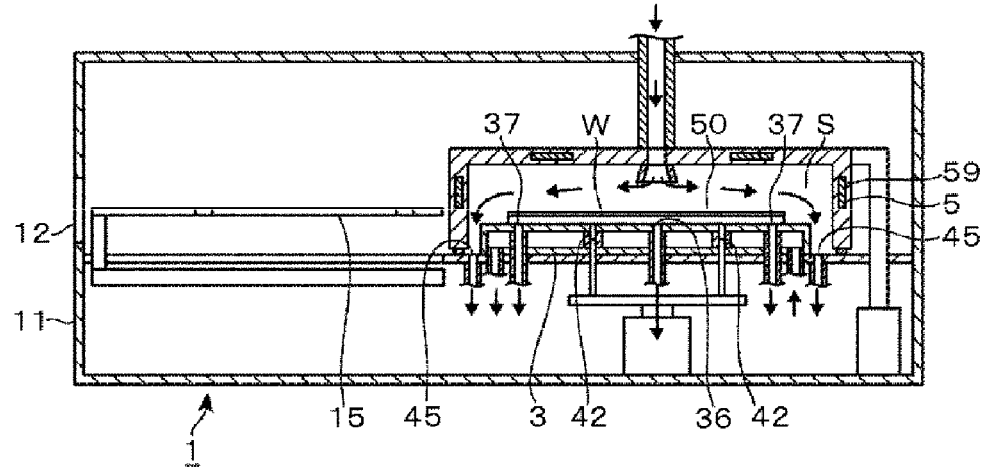

The cooling plate 15 is moved forward to above the temperature control plate 3 while cooling the wafer W. If the wafer W is transferred to above the temperature control plate 3 by the cooling plate 15, the elevating pins 42 are raised to hold the wafer W thereon (FIG. 4C). Then, the cooling plate 15 is retreated to the transfer port 12 (FIG. 5A), and the elevating pins 42 are lowered and the wafer W is mounted on the temperature control plate 3. A central portion and a peripheral portion of the wafer W are suctioned by the suction openings 36 and 37, so that the entire rear surface of the wafer W firmly adheres to the surface of the temperature control plate 3. The temperature of the entire wafer W is controlled to be substantially the same as the surface temperature of the temperature control plate 3, and the processing vessel 5 is lowered to thereby form the processing space S (FIG. 5B).

Figure 6A:
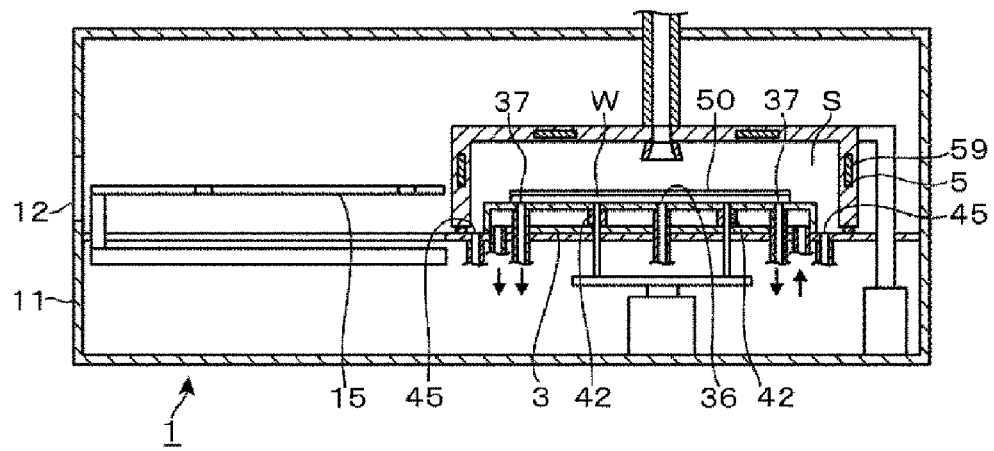
FIGS. 6A to 6C are process diagrams for illustrating a process sequence performed by the developing apparatus.
Figure 8B:
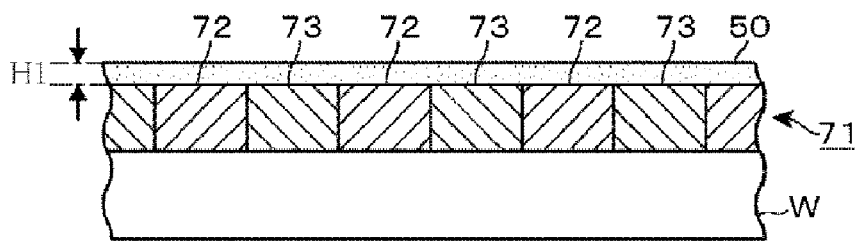

A developing atmosphere gas including developing mist is generated by the developing atmosphere gas heating unit and is supplied into the processing space S. If the developing mist adheres to the wafer W, and the developing solution film 50 of a predetermined thickness is formed (FIG. 5C), the supply of the developing atmosphere gas and the evacuation through the gas exhaust ports 45 are stopped, and a reaction between the developing solution film 50 and resist may progress (FIGS. 6A and 8B). In order to remove the developing solution film 50 later and save a usage amount of the developing solution, an adhesion amount of the developing mist is controlled such that a film thickness H1 of the developing solution film 50 may be in a range of, for example, about 1 μm to about 100 μm.

Figure 6B:
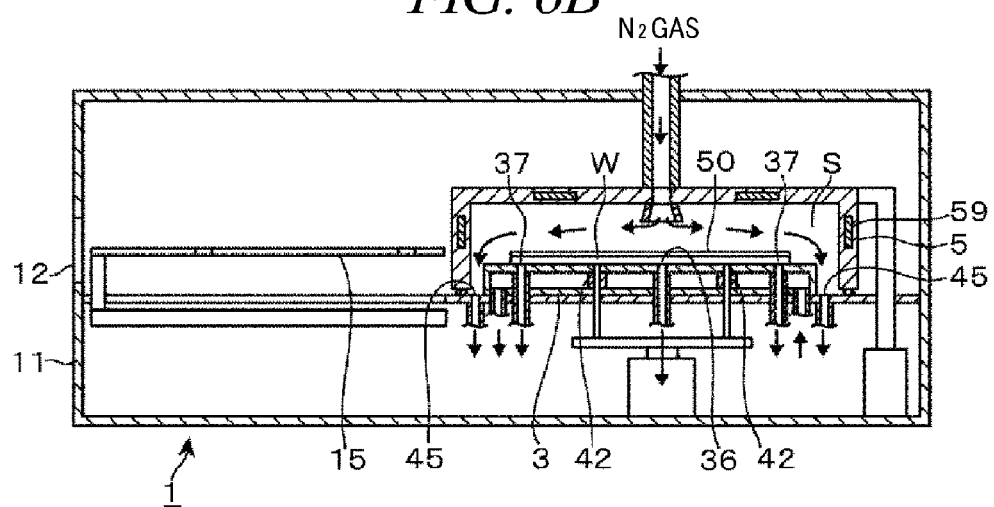
Figure 6C:
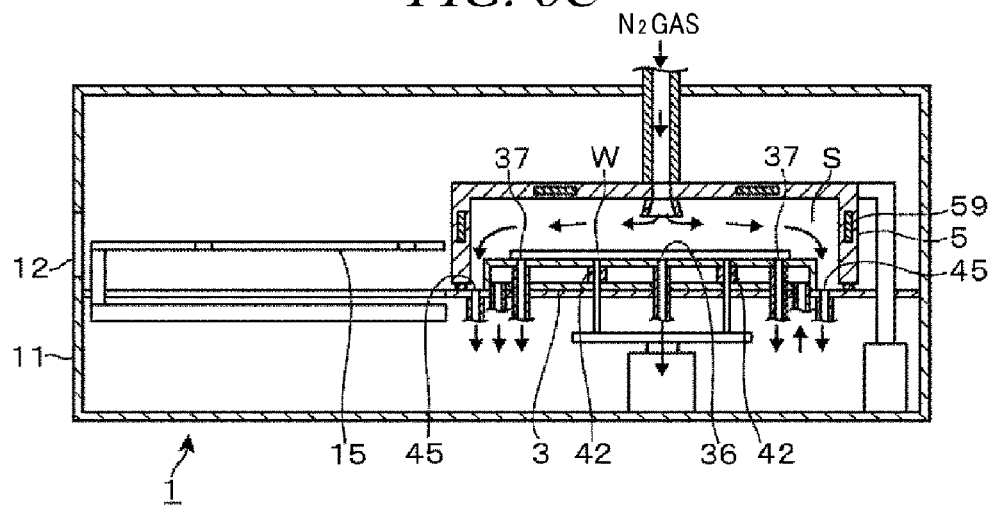
Figure 7A:
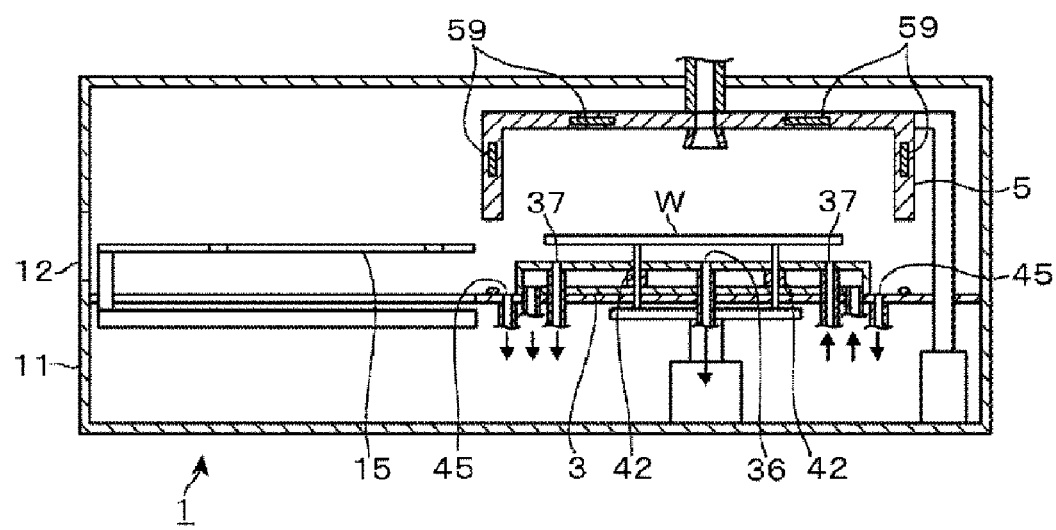
FIGS. 7A and 7B are process diagrams for illustrating a process sequence performed by the developing apparatus.
Figure 8C:
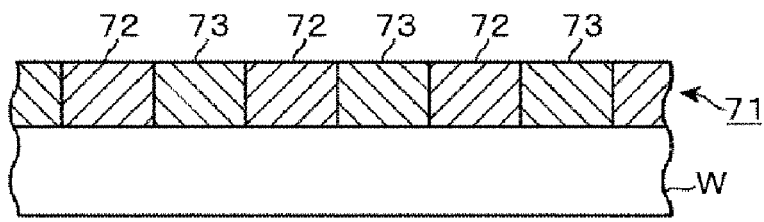

After the lapse of the preset time from the beginning of the supply of the developing atmosphere gas into the processing space S, the evacuation through the gas exhaust ports 45 is resumed and a $N_2$ gas heated to a predetermined temperature is supplied into the processing space S (FIG. 6B). Accordingly, the developing atmosphere gas within the processing space S is purged and removed, and the surface of the wafer W is dried by the $N_2$ gas (FIGS. 6C and 8C). Then, the supply of the $N_2$ gas is stopped, and the wafer W is raised apart from the temperature control plate 3 by the elevating pins 42. Further, the processing vessel 5 is raised, and, thus, the processing space S is opened to an external atmosphere (FIG. 7A).

Figure 7B:
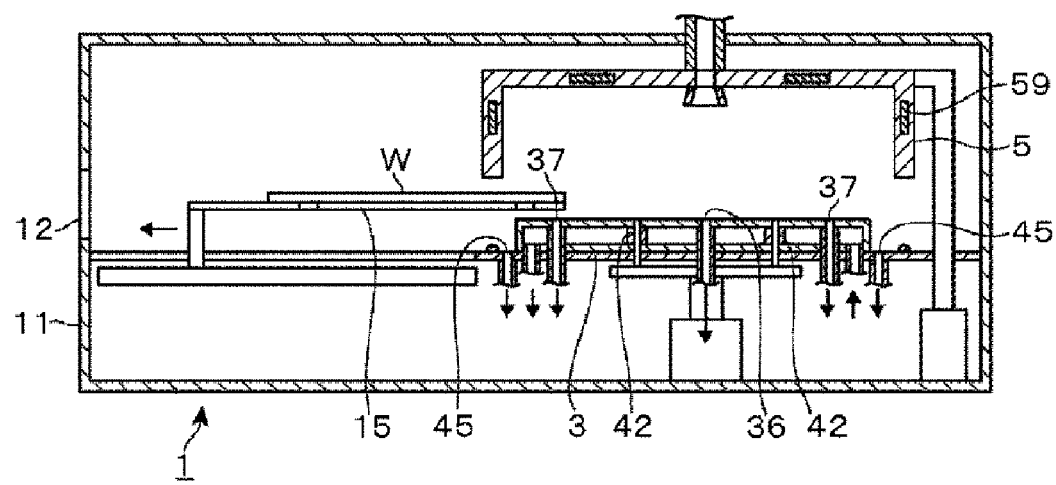
Figure 8D:
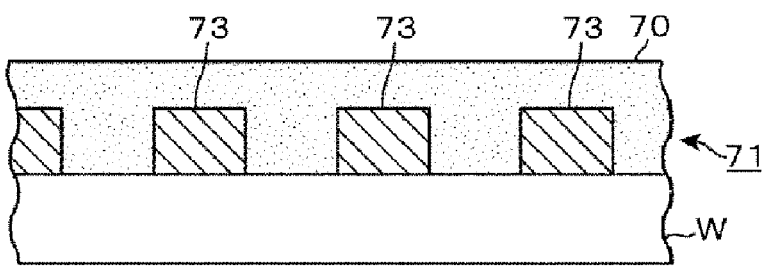
Figure 8E:
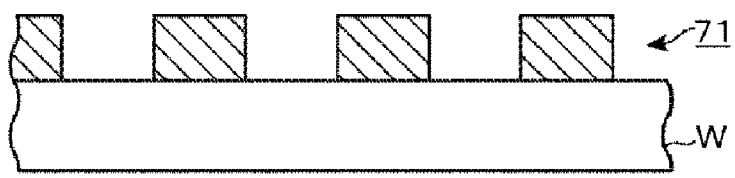

Thereafter, the cooling plate 15 is moved to above the temperature control plate 3, and the wafer W is mounted on the cooling plate 15, and, then, the cooling plate 15 is moved to the transfer port 12 (FIG. 7B). Then, the transfer mechanism 21 receives the wafer W in the reverse order to the order in which the wafer W is transferred onto the cooling plate 15, and the wafer W is transferred into a cleaning apparatus. In this cleaning apparatus, a cleaning solution 70 is supplied to the wafer W; the exposed part 72 is rinsed by this cleaning solution 70 and removed from the surface of the wafer W; and a resist pattern is developed as depicted in FIG. 8D. Subsequently, the cleaning solution 70 is removed and the wafer W is dried (FIG. 8E).

As described above, in this developing apparatus 1, the wafer W is mounted on the temperature control plate 3, the developing atmosphere gas including developing mist is supplied to the surface of the wafer W to form the developing solution film 50 thereon. Then, after the lapse of the preset time from the beginning of the supply of the developing atmosphere gas, the $N_2$ gas is supplied into the processing space S and the surface of the wafer W is dried. Accordingly, the reaction between the developing solution and the resist can be stopped, and, thus, it is possible to suppress deterioration of the resist pattern which may be caused by an excessive reaction therebetween. Therefore, since the wafer W can be transferred to the cleaning apparatus provided outside the developing apparatus 1 and the cleaning process can be performed in the cleaning apparatus, one wafer W may be processed in the developing apparatus 1 and another wafer W may be processed in the cleaning apparatus in parallel. As a result, improvement in throughput can be achieved.

Since the developing apparatus 1 does not supply the developing solution as in the conventional manner, a moving mechanism of a nozzle for supplying the developing solution or a rotation mechanism for rotating the wafer W held thereon is not necessary. Therefore, even if the apparatus for supplying the developing solution and the apparatus for supplying the cleaning solution are separated as described in this embodiment, a space where these apparatuses are provided need not become large.

In the first embodiment, after the lapse of the preset time from the beginning of the supply of the developing atmosphere gas, the wafer W may be dried by raising the processing vessel 5 to open the processing space S to an external atmosphere instead of supplying the $N_2$ gas into the processing space S. If the processing space S is opened, an atmosphere outside the processing vessel 5 flows around the wafer W, a partial pressure of the developing solution included in an atmosphere around the wafer W is decreased and a vapor pressure of the developing solution film 50 is decreased. Consequently, the liquid in the developing solution film 50 is evaporated and the surface of the wafer W becomes dry. Here, a dry condition of the wafer W means a condition where the liquid in the developing solution is removed and other components in the developing solution may remain on the wafer W. In evaluation tests to be described later, it has been demonstrated that if the liquid is removed, the reaction between the developing solution and the resist is stopped.

Second Embodiment

Figure 9:
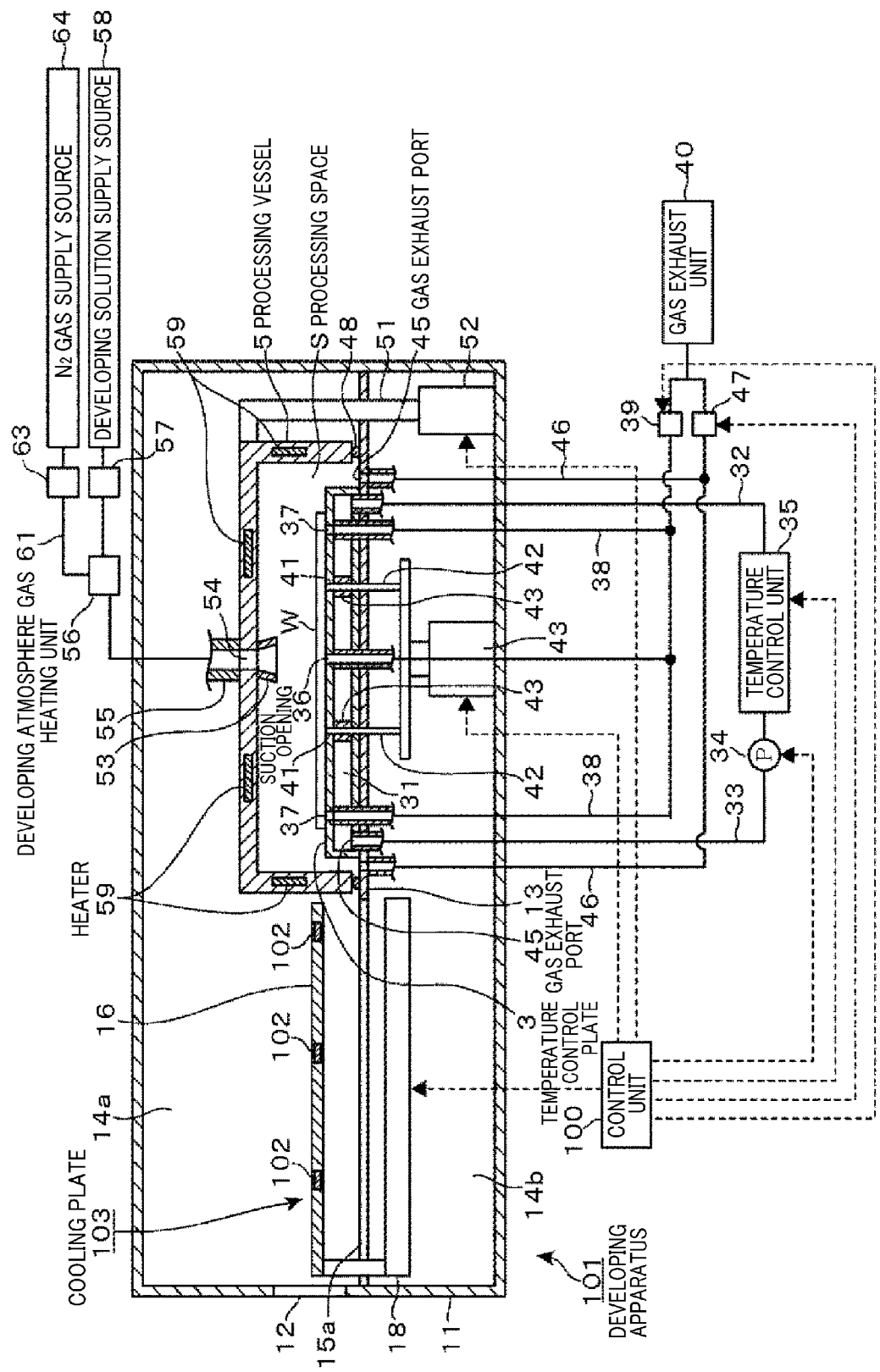
FIG. 9 is a longitudinal cross sectional view of a developing apparatus in accordance with a second embodiment.

A process of drying a surface of a wafer W is not limited to the above-described embodiment. Hereinafter, each embodiment of drying the surface of the wafer W will be explained. FIG. 9 is a longitudinal cross sectional view of a developing apparatus 101 in accordance with a second embodiment. As a difference between the developing apparatus 101 and the developing apparatus 1, a cooling plate 103 serving as a mounting plate including a heater 102 as a heating unit is provided in the developing apparatus 101. The cooling plate 103 has the same configuration as the cooling plate 15 except for the heater 102. In this developing apparatus 101, after a processing space S is opened and the wafer W is dried, the wafer W is heated by the cooling plate 103 and then dried. Therefore, a liquid of a developing solution film 50 is removed.

Figure 10A:
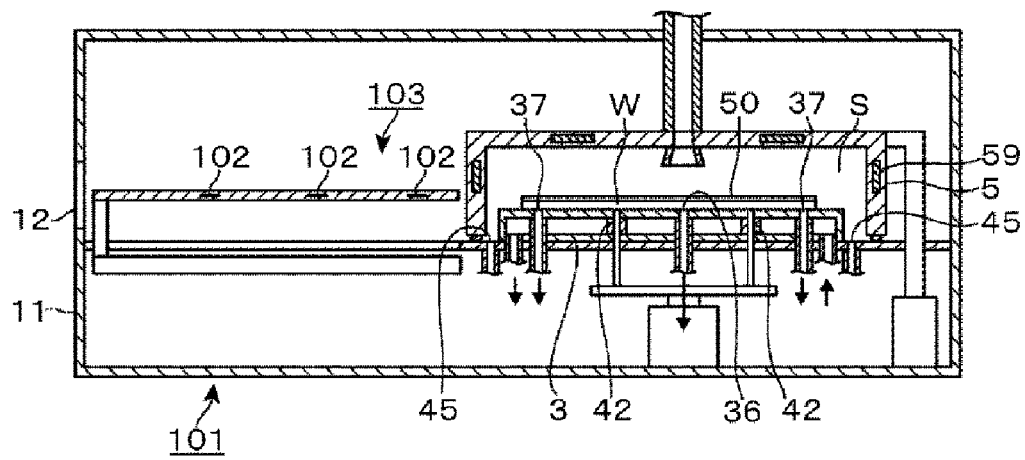
FIGS. 10A to 10C are process diagrams for illustrating a process sequence performed by the developing apparatus.

A process sequence performed by the developing apparatus 101 will be explained. Above all, in the same manner as the first embodiment, the wafer W is transferred by the cooling plate 103 toward a processing vessel 5. By way of example, while the wafer W is transferred to the processing vessel 5, output of the heater 102 is decreased and the wafer W is transferred to above a temperature control plate 3 while being cooled in the same manner as the first embodiment. The developing solution film 50 is formed as shown in the first embodiment, and the output of the heater 102 is increased and a temperature of the cooling plate 103 is increased (FIG. 10A).

Figure 10B:
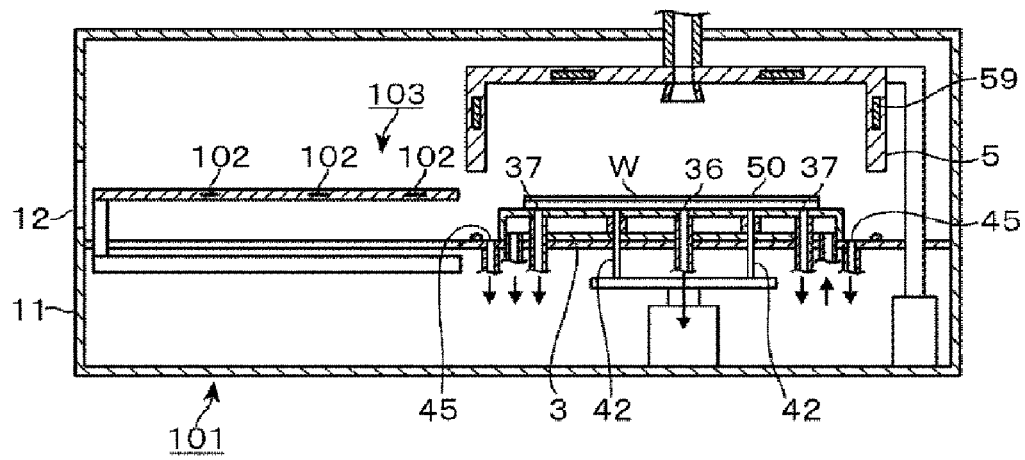
Figure 10C:
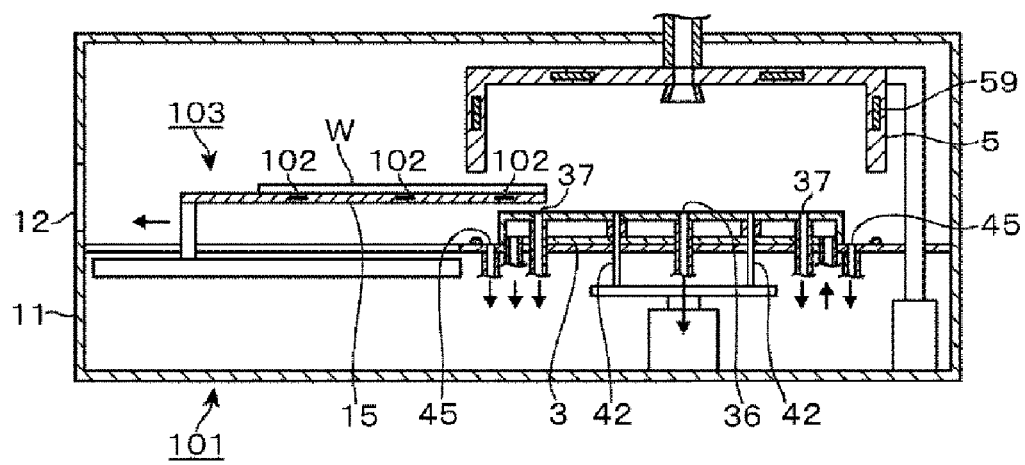

Then, after a lapse of a preset time after mounting the wafer W on the temperature control plate 3, a processing space S is opened to an external atmosphere and the wafer W is dried as described above (FIG. 10B). Thereafter, the wafer W is mounted on the cooling plate 103 and transferred to a transfer port 12 while being heated, and the liquid of the developing solution film 50 is removed (FIG. 10C). In the second embodiment, the same effects as obtained in the first embodiment can be achieved.

Alternatively, in the second embodiment, a moving heating plate may be provided instead of the cooling plate 103. This moving heating plate may have the same configuration as the cooling plate 103 except, for example, a flow path of water for cooling the wafer W. Accordingly, when the wafer W is transferred to the processing vessel 5, the moving heating plate does not cool the wafer W, and when the wafer W is transferred to the transfer port 12 from the temperature control plate 3, the moving heating plate heats the wafer W in the same manner as the cooling plate 103.

Third Embodiment

In a third embodiment, the developing apparatus 1 of the first embodiment is used. In the same manner as the first embodiment, a wafer W is mounted on a temperature control plate 3 and a developing solution film 50 is formed. Then, after a lapse of a preset time from the supply of a developing atmosphere gas into a processing space S, a temperature of the temperature control plate 3 is increased by a temperature control unit 35 to a temperature higher than a dew point of a developing solution, for example, a temperature equal to or higher than a boiling point. Accordingly, a liquid in the developing solution film 50 is evaporated and the wafer W becomes dry. Thereafter, the wafer W is unloaded from a processing vessel 5 in the same manner as the first and second embodiments.

In each embodiment described above, a maximum particle diameter of the developing mist is, for example, equal to or smaller than about 50 μm and an average particle diameter is, for example, equal to or smaller than 10 μm. By controlling a particle diameter as described above and supplying the developing mist in a dry fog, it is possible to prevent other areas than the wafer W from being wet with the developing solution during a developing process. Accordingly, defects in the developed pattern or generation of particles can be suppressed. Further, a method of forming the above-described developing atmosphere gas is not limited to heating the developing solution but ultrasonic waves may be applied to the developing solution.

A method of forming the developing solution film 50 is not limited to the above-described examples. By way of example, the developing atmosphere gas is heated to a temperature higher than a saturation temperature of the developing solution, for example, 50° C. by a heating atmosphere gas heating unit 56 and vapor of the developing solution (hereinafter, referred to as "developing vapor") is generated. The developing atmosphere gas of which temperature is controlled may be supplied into a processing space S and the wafer W may be cooled by the temperature control plate 3 and the developing vapor may be condensed on a surface of the wafer W. A process of the developing apparatus 1 in this case will be explained.

Figure 11A:
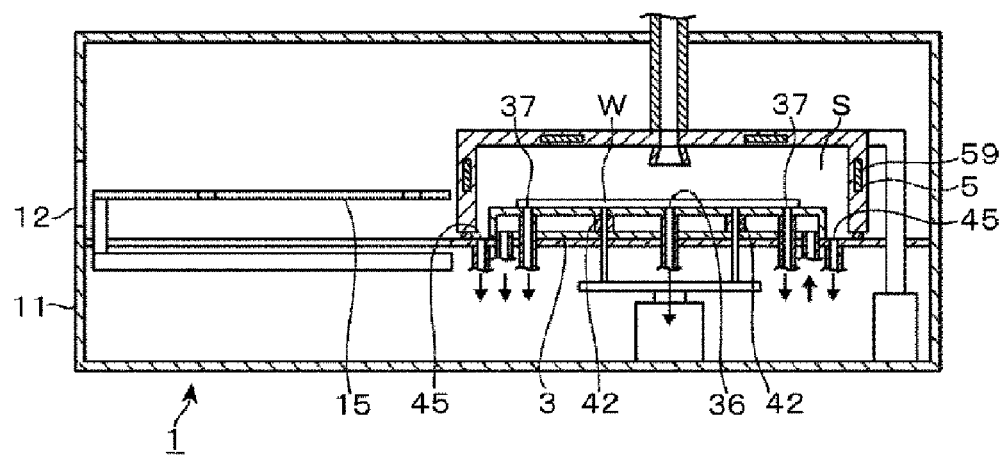
FIGS. 11A and 11B are process diagrams for illustrating another developing method performed by the developing apparatus of the first embodiment.
Figure 11B:
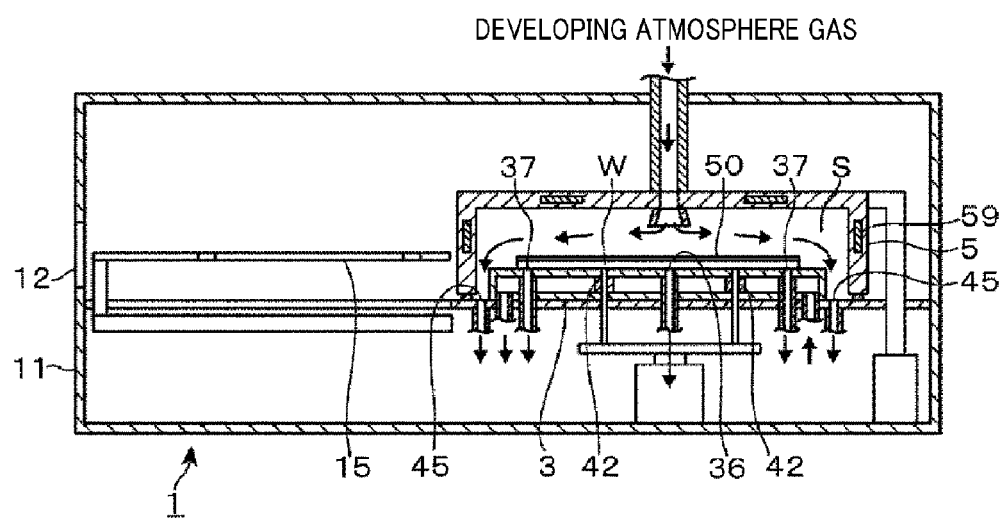

Above all, the heaters 59 maintain an inner wall of the processing vessel 5 at a temperature at which a developing atmosphere gas hardly condenses. Here, the temperature at which the developing atmosphere gas hardly condenses refers to a temperature at which the developing atmosphere gas does not condense and also refers to a temperature higher than a dew point of developing solution vapor included in the developing atmosphere gas supplied into the processing space S. Further, a wafer W is mounted on the temperature control plate 3 and is controlled to a temperature equal to or less than a dew point of developing vapor included in a developing atmosphere gas, and the processing space S is formed (FIG. 11A). The developing atmosphere gas is supplied into the processing space S, and the developing vapor is condensed on a surface of the wafer W (FIG. 11B). If a developing solution film 50 of a predetermined film thickness is formed, the supply of the developing atmosphere gas and evacuation through the gas exhaust ports 45 are stopped. Thereafter, as in the first embodiment, by supplying a $N_2$ gas, the developing atmosphere gas within the processing space S is removed and the wafer W is dried.

As stated above, even in case of supplying the developing atmosphere gas without containing the developing mist onto the wafer W, the same effects as obtained in the first embodiment can be still achieved. In case of supplying the developing atmosphere gas, it may be also possible to hold the wafer W by the elevating pins 42 apart from the temperature control plate 3 when the processing space S is formed, and it may be possible to mount the wafer W on the temperature control plate 3 after the developing atmosphere gas is supplied into the processing space S and then form the developing solution film 50. The developing solution which has been condensed on the temperature control plate 3 during the process is suctioned by the suction openings 36 and 37. Further, the developing atmosphere gas may include both the developing mist and the developing vapor, and in this case, the developing solution film 50 is formed by an adhesion amount of the developing mist and a condensation amount of the developing vapor.

Further, even if the developing solution film 50 is formed by condensing the developing solution, the wafer W may be dried by using the drying method of the other embodiments, for example, by opening the processing space S. Otherwise, it may be also possible to raise the wafer W apart from the temperature control plate 3 by, e.g., the elevating pins 42 and to dry the wafer W by heat of the developing vapor remaining in the processing space S. A timing for beginning each drying process is, for example, a time when a reaction between the developing solution and the resist is stopped, i.e., when an unnecessary resist can be removed if a cleaning process is performed.

In the above-described embodiments, particle generation due to the adhesion of the developing solution to the processing vessel 5 can be securely prevented by installing the heaters 59 in the processing vessel 5. However, the heaters 59 may be omitted. Instead, by way of example, a $N_2$ gas heated by the developing atmosphere gas heating unit 56 may be independently supplied into the processing space S to heat the inner wall of the processing vessel 5. Accordingly, a temperature of the inner wall may be controlled to be higher than a condensation temperature of the developing vapor, and the developing atmosphere gas may be supplied thereafter.

The methods of drying the wafer W described in the respective embodiments can be combined with each other. By way of example, the cooling plate 103 of the second embodiment can be applied to the first embodiment. After the supply of the $N_2$ gas, the wafer W can be heated by the cooling plate 103 to remove the developing solution film 50. If the developing solution film 50 is not removed by the cooling plate, the wafer W may be directly delivered between the transfer mechanism 21 and the elevating pins 42.

(Evaluation Tests)

(Evaluation Test 1)

A developing solution was supplied through a nozzle onto wafers W1 to W3 on which resist is coated and which is exposed to light via a preset pattern. For the wafer W1, an image of a cross section of the resist was captured after the developing solution is supplied. For the wafer W2, an image of a cross section of the resist was captured after the developing solution was supplied and then a cleaning solution was supplied for about 2 seconds. For the wafer W3, an image of a cross section of the resist was captured after the developing solution was supplied and then the cleaning solution was supplied for about 13 seconds. Further, the same experiment was conducted while varying the kind of the resist coated on the wafers W1 to W3.

FIGS. 12A to 12C provide results of the evaluation test 1. FIGS. 12A to 12C show images of the wafers W1 to W3 using the same kind of resist, and FIGS. 12D to 12F show images of the wafers W1 to W3 using another same kind of resist. Regardless of the kinds of the resist, patterns were not developed on the wafer W1 on which the cleaning solution was not supplied, whereas patterns were developed on the wafers W2 and W3 on which the cleaning solution was supplied. As can be seen from the result of this experiment, the exposed resist starts to be dissolved in the process that the cleaning solution is supplied, not in the process that the developing solution is supplied. That is, the result shows that it is not by the developing solution that dissolved resist residues are removed. Accordingly, when a developing process is performed, it is deemed to be enough to supply a small amount of developing solution onto the resist. Through this experiment, the present inventors have reached the idea of forming the thin film of the developing solution by supplying the developing mist onto the surface of the wafer W.

(Evaluation Test 2)

Exposed wafers W1 and W2 were prepared as in the evaluation test 1. The wafer W1 was mounted on a spin chuck, and a developing solution was supplied through a nozzle while rotating the wafer W1 about a vertical axis by the spin chuck. While supplying the developing solution, a supply position of the developing solution was moved from a periphery of the wafer W1 toward a center thereof in a diametric direction, and, then, the developing solution toward the center of the wafer W1 was continuously supplied for a preset time. After the completion of the supply of the developing solution, the developing solution was removed by supplying a cleaning solution onto the wafer W1. Then, an image of a cross section of resist was captured.

Further, the wafer W2 was transferred into a processing vessel including a vessel main body and a top lid. After an airtightly sealed processing space is formed within the processing vessel by closing the top lid, a processing atmosphere was created by supplying developing mist into the processing space while evacuating the processing space, as in the second embodiment. After the supply of the developing mist, the developing solution was removed by supplying the cleaning solution onto the wafer W2, and an image of a cross section of resist was captured.

Figure 13A:
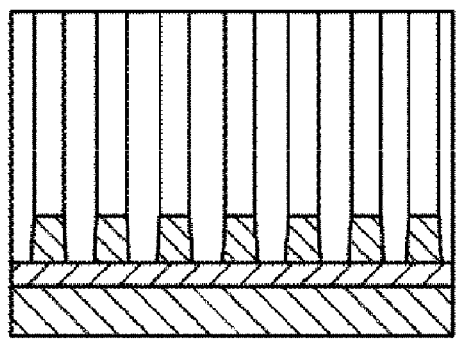
FIGS. 13A to 13D are longitudinal cross sectional views of wafers obtained in an evaluation test.
Figure 13B:
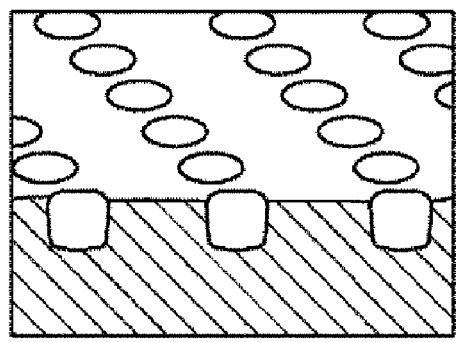
Figure 13C:
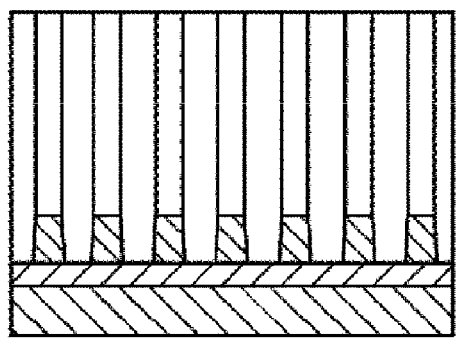
Figure 13D:
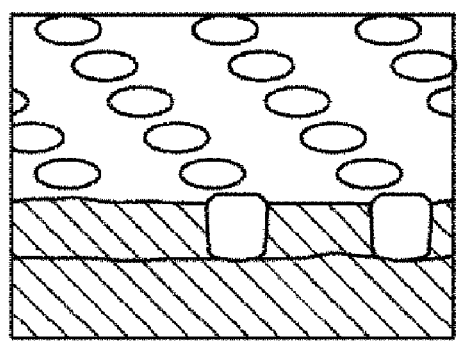

FIGS. 13A and 13B show images of the wafer W1, and FIGS. 13C and 13D show images of the wafer W2. As can be seen from the figures, there is almost no difference between pattern shapes formed on the wafers W1 and W2. From this experiment, it is proved that a developing process can be performed by using the mist of the developing solution in the same way as in the case of supplying the developing solution through the nozzle.

(Evaluation Test 3)

A plurality of exposed wafers W was prepared as in the evaluation tests 1 and 2. The wafers W were sequentially transferred into a processing vessel including a vessel main body and a top lid. After an airtightly sealed processing space is formed by closing the top lid, a processing atmosphere was created by supplying developing mist into the processing space while evacuating the processing space. The supply time of the developing mist was varied from about 45 seconds to about 60 seconds and to about 90 seconds for each wafer W. After the developing mist was supplied, the processing space was opened to an external atmosphere by opening the top lid and the wafer W was taken out and a cleaning process was performed on the wafer W. A CD average of a resist pattern at each portion on the surface of each wafer W was calculated and 3 σ as an index of non-uniformity was also calculated for CD. Experiments in which the supply time of the developing mist was set to be 45 seconds, 60 second and 90 seconds will be referred to as evaluation tests 3-1, 3-2 and 3-3, respectively.

(Evaluation Test 4)

As in the evaluation test 3, a CD average and 3 σ were calculated for wafers W on which a cleaning process was performed after a developing solution was supplied through a nozzle as in the evaluation test 2. The supply time of the developing solution through the nozzle was varied for each wafer W. Experiments with different supply times will be referred to as evaluation test 4-1, 4-2 and 4-3 in the order in which the supply time is shortest.

(Evaluation Test 5)

A developing solution was discharged onto wafers W through a nozzle having a discharge opening elongated in a diametric direction of the wafer W while moving the nozzle from one end of the wafer W to the other end thereof. After liquid is accumulated on the wafers W, a cleaning process was performed. The supply time of the developing solution was varied for each wafer W. Experiments in which the supply time of the developing solution was set to be about seconds and about 60 seconds will be referred to as evaluation test 5-1 and 5-2, respectively.

Figure 14:
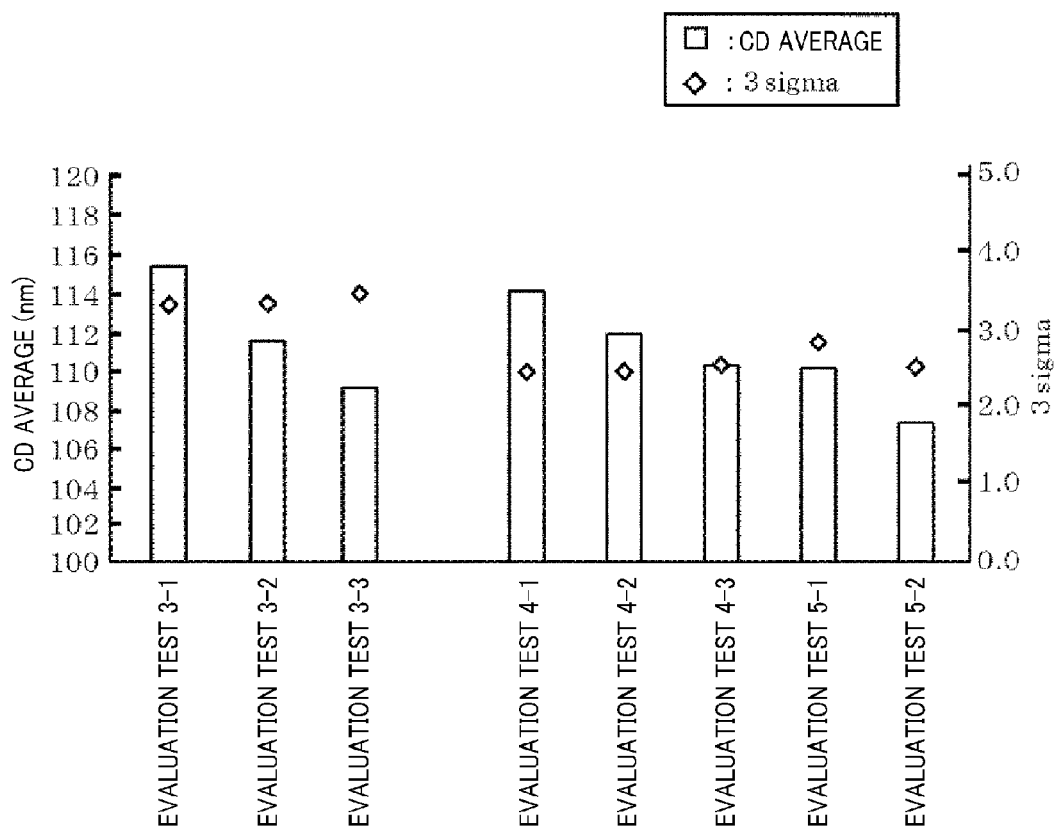
FIG. 14 is a graph showing CD averages and 3 σ values of patterns obtained in an evaluation test.

FIG. 14 shows results of the evaluation tests 3 to 5. In FIG. 17, bar graphs indicate CD averages in the respective evaluation tests, and dots indicate 3 σ values in the respective evaluation tests. From these results, it is found out that the CD average decreases with the rise of the supply time of the developing solution when the mist of the developing solution is supplied, as in the case of supplying the developing solution through the nozzle. Further, as for the 3 σ values, there is found no great difference between the two cases when the mist of the developing solution is supplied and when the developing solution is supplied through the nozzle. From the results of the evaluation tests, it is proved that a developing process using the developing mist does not have a great influence on a pattern shape as compared to a developing process performed by supplying the developing solution through the nozzle.

(Evaluation Test 6)

As in the evaluation test 3, developing mist was supplied into a processing space in which an exposed wafer W is loaded while evacuating the processing space. The supply time of the developing mist was set to about 30 seconds. After the supply of the developing mist was stopped, a surface of the wafer W was dried by opening the processing space to an external atmosphere, and a cleaning process was performed on the wafer W afterward. Then, as in the evaluation test 3, a CD average of a resist pattern and 3 σ of CD values were calculated for each wafer W. A time period from the stoppage of the supply of the developing mist till the opening of the processing space was set to be about 30 seconds and about 180 seconds for each wafer W. Experiments in which the time period till the opening of the processing space was set to about 30 seconds and about 180 seconds will be referred to as evaluation tests 6-1 and 6-2, respectively.

Further, the same experiments as the evaluation tests 6-1 and 6-2 were performed by setting the supply time of the developing mist to about 60 seconds. A time period from the stoppage of the supply of the developing mist till the opening of the processing space was set to be about 0 second, about 30 seconds and about 180 seconds for each wafer W. Experiments in which the time period till the opening of the processing space was set to 0 second, about 30 seconds and about 180 seconds will be referred to as evaluation tests 6-3, 6-4 and 6-5, respectively.

Figure 15:
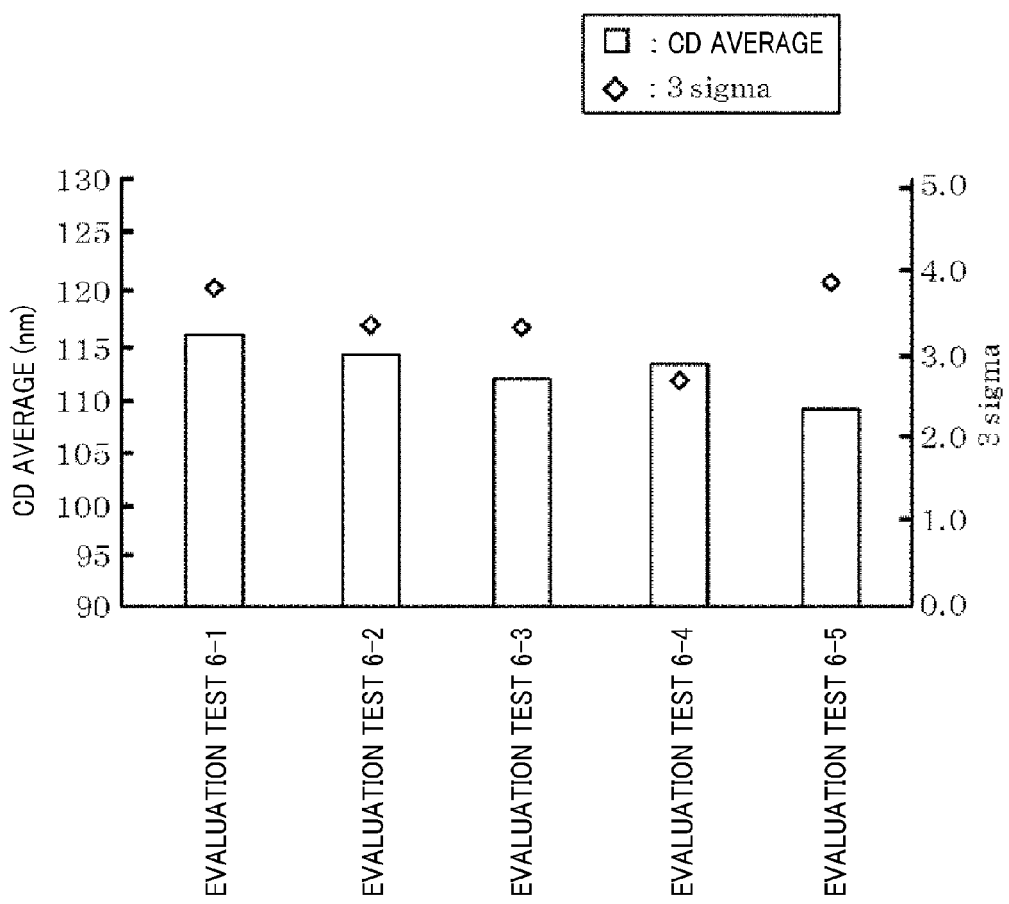
FIG. 15 is a graph showing CD averages and 3 σ values of patterns obtained in an evaluation test.

FIG. 15 shows a result of the evaluation test 6. In FIG. 18, bar graphs indicate CD averages and dots indicate 3 σ values. In the evaluation test 6-5, a 3 σ value is found to be slightly greater than 3 σ values in the evaluation tests 6-1 to 6-4, which indicates that CD non-uniformity of the resist pattern is slightly higher in the evaluation test 6-5. Furthermore, the CD averages are found to decrease with the rise of the time period till the opening of the processing space. It is deemed to be because surfaces of the wafers W were not dried due to the developing mist remaining in the processing space and the developing process further progressed even after the supply of the developing mist was stopped. From the result of the evaluation test 6, it is found out that a pattern shape is affected by a time period taken until a surface of a wafer W is dried.

(Evaluation Test 7)

As in the evaluation test 3, developing mist was supplied into a processing space in which an exposed wafer W is loaded while evacuating the processing space. The supply time of the developing mist was set to about 60 seconds. After the supply of the developing mist was stopped, a surface of the wafer W was dried by opening the processing space to an external atmosphere, and a cleaning process was performed on the wafer W afterward. A time period from opening of the processing space till the cleaning process was performed was set to be about 10 seconds, about 45 seconds, about 90 seconds, about 180 seconds and about 600 seconds for each wafer W. Then, as in the evaluation test 3, a CD average of a resist pattern and 3 σ of CD values were calculated for each wafer W. Experiments in which the time period till the cleaning process was performed was set to about 10 seconds, about 45 seconds, about 90 seconds, about 180 seconds and about 600 seconds will be referred to as evaluation tests 7-1, 7-2, 7-3, 7-4 and 7-5, respectively.

Figure 16:
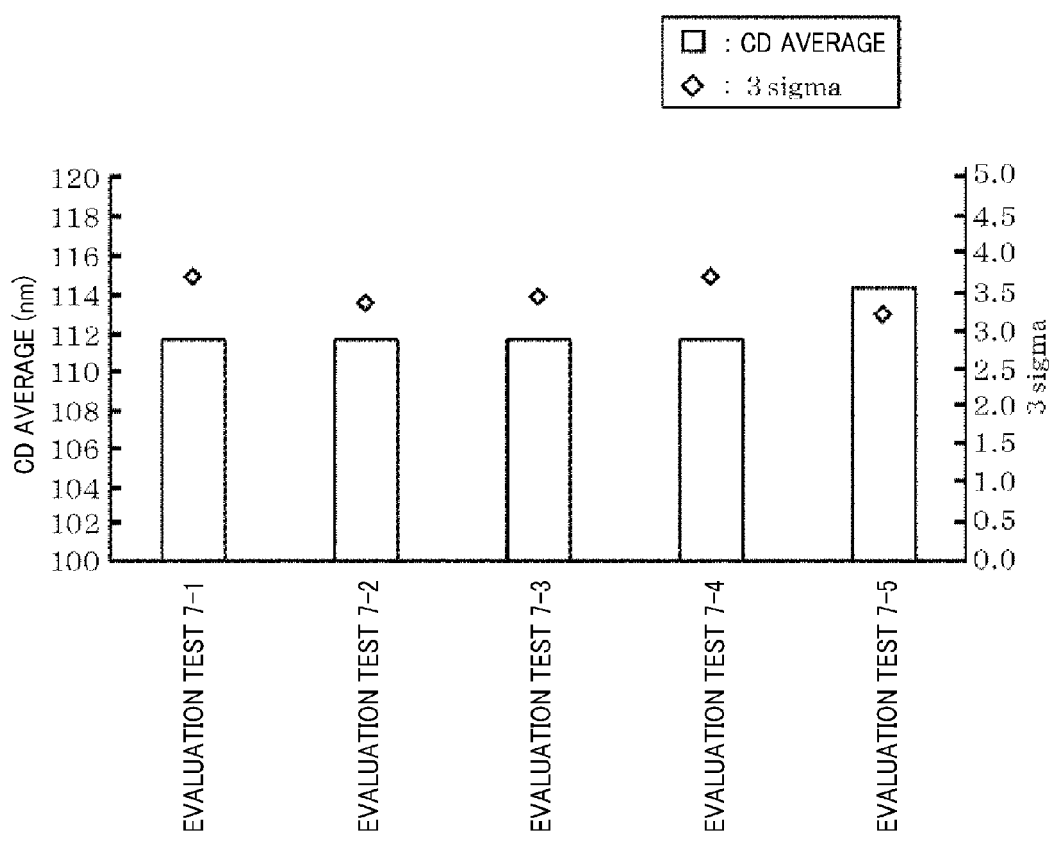
FIG. 16 is a graph showing CD averages and 3 σ values of patterns obtained in an evaluation test.

FIG. 16 shows a result of the evaluation test 7. In FIG. 16, bar graphs indicate CD averages and dots indicate 3 σ values. The CD average and the 3 σ value are found to be not greatly varied between the experiments, which indicates that a time period taken until a cleaning process is performed after a wafer W is dried does not have a great influence on a pattern shape. Accordingly, as can be seen from this result, after a surface of the wafer W is dried, the wafer W is transferred into to a cleaning apparatus and the cleaning process can be performed on the wafer W, as in the above-described embodiments.

What is claimed is:

1. A developing apparatus that develops an exposed substrate, the apparatus comprising:
    an airtightly sealed processing vessel that forms a processing atmosphere therein;
    an atmosphere gas supply unit that supplies an atmosphere gas containing mist of a developing solution into the processing vessel in order to form a liquid film of the developing solution on a surface of a substrate loaded into the processing vessel; and
    a drying unit that includes a vessel opening/closing mechanism for opening the processing atmosphere within the processing vessel to an external atmosphere and dries the substrate in order to stop a developing process by the liquid film.

2. The developing apparatus of claim 1, wherein the drying unit includes:
    a mounting plate that is provided in the processing vessel and mounts the substrate thereon; and
    a heating unit that heats the mounting plate.

3. The developing apparatus of claim 1, wherein the drying unit includes:
    a moving plate that receives the substrate mounted within the processing vessel and transfers the substrate to the outside of the processing vessel; and
    a heating unit that is provided in the moving plate and heats the moving plate.

4. The developing apparatus of claim 1, wherein the drying unit includes a drying gas supply unit that supplies a drying gas to the substrate within the processing vessel.

5. The developing apparatus of claim 1, wherein the atmosphere gas supply unit supplies a gas including vapor of a developing solution into the processing vessel in order to form a liquid film by condensing the developing solution on a surface of the substrate instead of supplying the mist of the developing solution in order to form the liquid film of the developing solution on the surface of the substrate, and a temperate control plate on which the substrate is mounted and which controls a temperature of the substrate so as to condense the vapor on the surface of the substrate is provided.

6. The developing apparatus of claim 1, wherein the atmosphere gas supply unit includes a heating unit that heats the atmosphere gas.

7. The developing apparatus of claim 6, wherein the atmosphere gas is heated to a temperature higher than a saturation temperature of the developing solution in a heating atmosphere.

8. A developing method for developing an exposed substrate, the method comprising:
    loading the substrate into an airtightly sealed processing vessel that forms a processing atmosphere therein;
    supplying an atmosphere gas containing mist of a developing solution into the processing vessel to form a liquid film of the developing solution on a surface of the substrate; and
    drying the substrate in order to stop a developing process by the liquid film, wherein the drying process includes opening the processing atmosphere within the processing vessel to an external atmosphere.

9. The developing method of claim 8, wherein the drying process includes heating the substrate via a mounting plate when the substrate is mounted on the mounting plate within the processing vessel.

10. The developing method of claim 8, wherein the drying process includes:
    receiving the substrate mounted within the processing vessel by a moving plate that moves between the inside and the outside of the processing vessel; and
    heating the substrate via the moving plate.

11. The developing method of claim 8, wherein the drying process includes supplying a drying gas to the substrate within the processing vessel.

12. The developing method of claim 8, further comprising:
    supplying a gas containing vapor of a developing solution into the processing vessel in order to form a liquid film by condensing the developing solution on the surface of the substrate instead of supplying the atmosphere gas containing mist of the developing solution in order to form the liquid film of the developing solution on the surface of the substrate; and
    controlling a temperature of the substrate such that the vapor is condensed on the surface of the substrate.

13. The developing method of claim 8, further comprising: heating the atmosphere gas by a heating unit.

14. The developing method of claim 13, wherein the atmosphere gas is heated to a temperature higher than a saturation temperature of the developing solution in a heating atmosphere.

15. A storage medium that stores therein a program to be used in a developing apparatus that develops an exposed substrate within a processing vessel,
    wherein the program includes processing steps for implementing a developing method as claimed in claim 8.

* * * * *

UNITED STATES PATENT AND TRADEMARK OFFICE
CERTIFICATE OF CORRECTION

PATENT NO. : 8,333,522 B2
APPLICATION NO. : 13/025490
DATED : December 18, 2012
INVENTOR(S) : Arima et al.

It is certified that error appears in the above-identified patent and that said Letters Patent is hereby corrected as shown below:

In the Specification; column 5, line 52, please add -- 32 -- after the word "pipe".

Signed and Sealed this
Fourteenth Day of May, 2013

Teresa Stanek Rea
*Acting Director of the United States Patent and Trademark Office*